United States Patent [19]

Spechler

[11] 4,376,159
[45] Mar. 8, 1983

[54] METHOD OF PREPARING MATTE FINISH COLOR-PROOFING SURPRINTS

[75] Inventor: Daniel S. Spechler, Brooklyn, N.Y.

[73] Assignee: Keuffel & Esser Company, Morristown, N.J.

[21] Appl. No.: 340,565

[22] Filed: Jan. 18, 1982

Related U.S. Application Data

[62] Division of Ser. No. 795,339, May 9, 1977.

[51] Int. Cl.³ .......................... G03C 1/68; G03C 5/00
[52] U.S. Cl. .................................... 430/293; 430/950;
430/14; 430/291; 430/331; 430/257
[58] Field of Search ............... 430/950, 291, 293, 294, 430/257, 331

[56] References Cited

U.S. PATENT DOCUMENTS 3,904,441 9/1975 Erickson et al. .................... 430/257
3,920,456 11/1975 Nittel et al. ...................... 430/950 X
4,286,046 8/1981 Cohen et al. ......................... 430/272

Primary Examiner—John D. Welsh
Attorney, Agent, or Firm—Lionel N. White

[57] ABSTRACT

The finished surface of a multicolor surprint proof is made to exhibit a matte appearance and closely simulate the surface texture of the printing stock to which it is applied. Individual colored image adhesive layers are laminated in register to a receptor sheet which comprises a coated layer of film-forming polymer composition on a polyester carrier sheet having a matte texture surface. Subsequent to final adhesive lamination of the assembled surprint to desired printing stock, the receptor carrier sheet is stripped from the polymer film layer to yield a tough protective film overlayer which complements the matte texture of the original receptor carrier sheet surface and provides the desired matte appearance of the multicolor proof.

5 Claims, 1 Drawing Figure

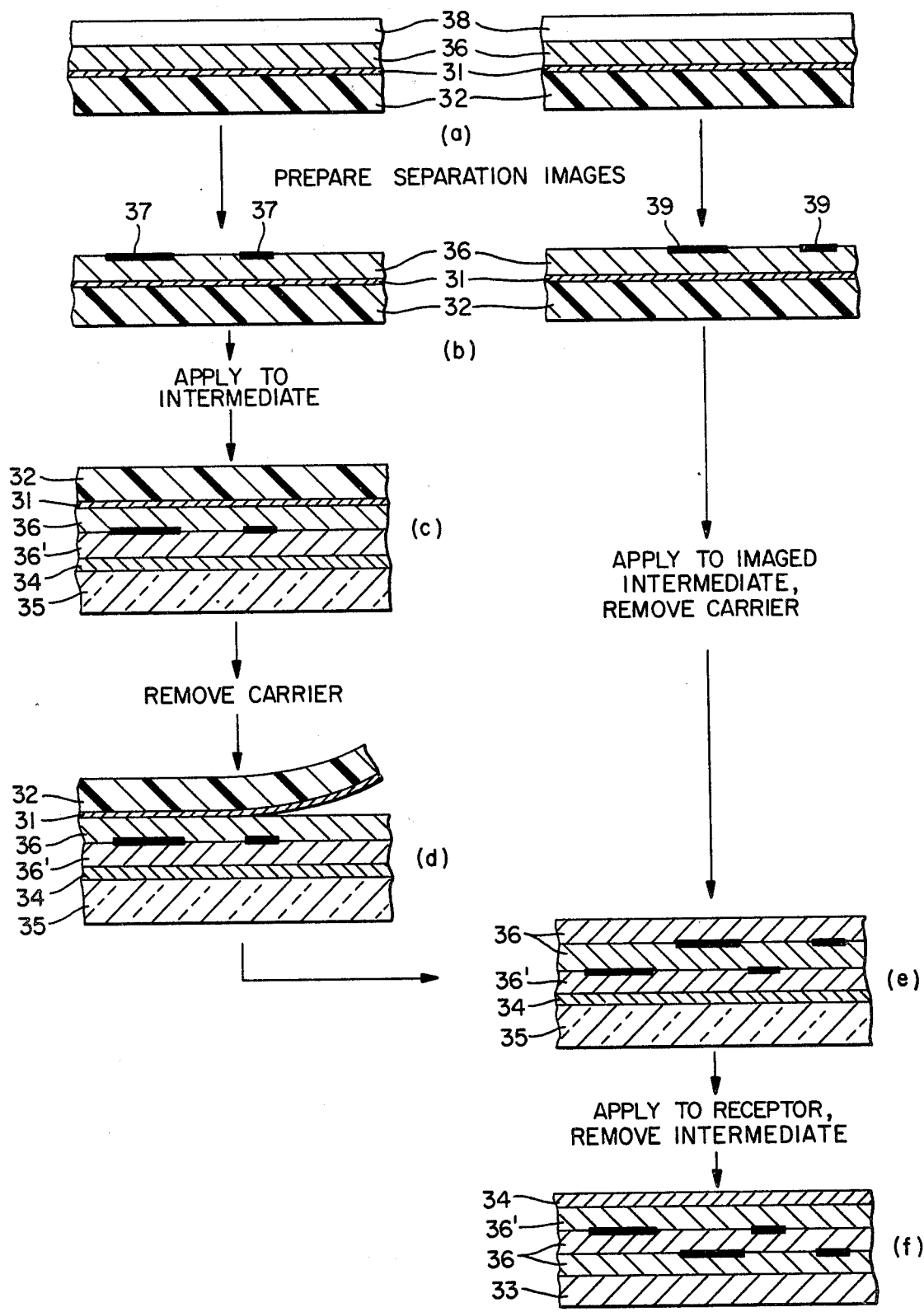

METHOD OF PREPARING MATTE FINISH COLOR-PROOFING SURPRINTS

RELATED APPLICATION

This application is a division of co-pending application Ser. No. 795,339, entitled "Color-Proofing Material and Method", filed May 9, 1977.

BACKGROUND

In the printing arts, particularly lithography, where multicolor printing is employed, it is necessary, prior to any extended printing run, to ensure the quality of the color separation negatives, or diapositives, from which the printing plates are prepared. While "proof press" practice remains significantly widespread, there has been an increase in the use of "color-proofing" materials and procedures. Contrary to the proof press methods which entail the preparation of actual printing plates for the generation of ink impression prints, the color-proofing materials provide means for the intermediate representation of the color separations which are in great measure sufficiently faithful to the separation photography to serve as indicators of the final printing impressions which might be expected from a printing run.

The more successful color-proofing materials have generally been of two types, comprising either sets of precolored or pigmented photosensitive sheets which are exposed to the set of color separation originals and processed to provide a series of colored proof images which superimposed yield a multicolor representation of the final work, or photosensitive sheet materials which are substantially colorless yet respond to photographic exposure to yield latent images which may be colored respectively with the primary hues in the form of pigments, inks, or dyes.

The former of these two types of color-proofing materials, i.e., the precolored sheets, are generally deemed less advantageous in view of the fact that the depth or intensity of color cannot readily be varied. The requirement for a large inventory of variously colored sheet materials further detracts from their utility. For these reasons it has been recognized that the proofing materials which can be employed in a post-coloring process are better adapted to the lithographer's needs in providing preliminary reproductions of the color separation originals in those tones and variations of color intensity which will be required in the final printing.

Among the post-colored proofing materials are those described in U.S. Pat. No. 3,060,024 where a photopolymer exposed to render light struck areas less tacky under applied heat is developed by the application of a finely-divided process pigment, the pigmented image being transferred with heat to a receptor sheet in register with other prints of the set; and in U.S. Pat. No. 3,634,087 where a diazo resin layer, exposed to a color separation original, is developed with an alkaline fluid to remove unexposed areas and yield an image which is colored with an ink/lacquer emulsion, the imaged proof sheet then being superimposed in registry upon other proof sheets of the set.

Particularly useful methods for preparing surprint proofs of broad utility and exceptional fidelity are described in U.S. Pat. No. 4,174,216 and the above-identified related application Ser. No. 795,339, and generally comprise the imagewise removal of portions of an overlying and non-tacky masking layer from a supported, tacky adhesive layer with subsequent toning or coloring of the revealed adhesive image by the application of colored powder. A plurality of such imaged layers in different colors may be, in register, formed on or laminated to film, foil, or paper stock to provide the surprint proof.

In order to protect the surface of the surprint proof, it is commonly the practice to laminate to such surface a thin transparent film of polyester or the like, or a layer of photopolymer which may be polymerized by overall exposure to actinic radiation to form a tough, protective membrane. These prior practices, however, generally result in the formation of a smooth, glossy surface on the surprint which in some circumstances detracts from the desired appearance of the proof. In many instances, for example, it is preferred that the surface of a multilayer proof print exhibit a matte, or non-glossy, texture in order to closely resemble actual printing on stock which lacks a coated or natural sheen.

Various means have been attempted to reduce the glossy appearance of the noted type of surprint proof, yet none has proven sufficiently simple and effective. The application to the surface of the print of powdered pigments, pigmented sprays or lacquers, or aqueous dispersions of pigments, all as mentioned, for example, in U.S. Pat. No. 4,286,046, poses problems of expense, cleanliness, and health while failing to provide a matte of acceptable uniformity, texture, and appearance.

SUMMARY

Sheet material useful in the color-proofing method described in the noted related application consists essentially of a carrier web, such as plastic film; a coating on such carrier of a layer of a pressure-sensitive adhesive exhibiting at least a significant degree of adhesive attraction for dry powdered pigments, dyes, or dusts; and an overlying coating, substantially coextensive with the pressure-sensitive adhesive layer, of a photoresist material which undergoes a photolytic change in solubility with respect to a developing solution in those areas which are exposed to light.

This color-proofing material may be employed to obtain a proof by placing the photoresist layer surface of the material in close contact with a color separation original, exposing the combination to actinic radiation which effects a change in the solubility of the photoresist material, applying a developer solution to effect removal of the photoresist layer in those areas rendered more soluble by the photolytic effect of the exposure, thereby forming "open window" areas in the resist layer which reveal the underlying pressure-sensitive adhesive layer, and wiping over the resist surface of the material with a powdered pigment which adheres to and colors the areas of revealed pressure-sensitive adhesive to yield a precise copy of the separation original in the appropriate primary color.

The imaged sheet may then be re-exposed over the whole of the remaining photoresist layer surface to render those layer parts soluble and developer solution applied to remove the residual photoresist material, resulting in a pigment image upon a background of pressure-sensitive adhesive. These adhesive areas may then be employed to affix over the surface of the pigment image a thin transparent protective sheet, such as a plastic film, to allow the proof to be manipulated without fear of displacement or marring of the precise image reproduction, or the pigment-imaged layer may be adhered to a receptor sheet which is precisely the stock upon which the final printing run is to be made. In either case the viewing surface exhibits the gloss of the overlying film.

Alternatively, where the carrier sheet of the proofing material is selected from plastic films, such as polyolefins or polyethylene terephthalate, which naturally exhibit a low adherend, or abherent, property or from other sheet materials, such as paper, coated with compositions such as the silicone resins commonly used in the preparation of release sheets in pressure-sensitive adhesive product manufacture, it is readily possible to transfer the imaged adhesive layer to the selected receptor sheet material merely by the application of pressure followed by removal of the carrier film. The revealed adhesive layer may be used to facilitate the registered transfer of additional complementary colored images or there may be coated an interlayer of a non-tacky resin material between the release surface of the carrier and the adhesive layer to serve as a stripping layer and to render the final print upon the receptor sheet non-tacky and resistent to handling.

In these alternatives also the outermost layer after transfer exhibits the gloss of the carrier film surface and previously necessitated the use of one or another of the noted deglossing or matting procedures with their attendant disadvantages. The present invention avoids the previous problems encountered in attempts to achieve a satisfactory matte finish or powder-toned surprint proofs, and comprises the use of an abherent carrier sheet material, such a polyethylene terephthalate polyester film, which exhibits a matte-textured surface and a coating of such surface of a layer of film-forming composition to the surface of which is imparted a submicroscopic texture as a result of solidification in contact with the matte-surfaced carrier. This combination of tough stripping film material and matte-surfaced carrier may be employed in the colorproofing sheet as described above or, preferably, such a combination having an additional layer of tacky, pressure-sensitive adhesive coated on the stripping layer may be used as in intermediate receptor sheet upon which pigment-imaged adhesive layers of a surprint may be assembled in registration prior to transfer to a printing stock receptor sheet. When subsequently the textured-surface carrier sheet is stripped away, there remains the tough, non-tacky, matte-surfaced stripping layer of imperceptible thickness which protects the underlying imaged adhesive layer assemblage and exhibits the desired non-glossy viewing surface.

Textured carrier films useful in the preparation of these materials are commercially available from a number of manufacturers and may generally comprise particles of pigment or the like dispersed in a polyester resin. Similarly textured coatings of adherent or release resins or polymers on carrier sheets may, of course, likewise be employed. A coating of any suitably compounded or plasticized film-forming polymeric material, such as a polyvinyl alcohol, polyvinyl acetate, or polyamide resin may serve as the stripping layer. Pressure-sensitive adhesive materials suitable for use in the present invention may be compounded from numerous readily available resinous and polymeric materials. Included among these are natural rubbers, vinyl polymers and co-polymers, and synthetic elastomers, such as polyisobutylene and vinyl ether compounds. The degree of tack exhibited by the pressure-sensitive adhesive may be readily varied by the addition of plasticizers and tackifiers, such as esterfied resins or short chain resins, or by the blending of polymers and elastomers of varying molecular weight and natural adhesive tack properties.

DRAWING

The accompanying drawing shows an embodiment of the present invention as used in the preparation of a multi-color proof.

DESCRIPTION

A method of forming multi-color proofs according to the present invention may generally utilize materials and processing described in the noted related application. One such type of sheet material, shown at stage (a) of the drawing, comprises a carrier film sheet 32 to which is bonded a thin layer 31 of release material, such as a polysiloxane resin, a pressure-sensitive adhesive layer 36, and an overlayer of photoresist 38. Processing of such color-proofing material to form a colored image comprises image-wise exposure of the photoresist layer 38 to actinic radiation, development by an overall application of a developer solution to the surface of photoresist layer 38, the light-struck portions of layer 38 being removed to yield open-window areas in the photoresist layer, coloring by the application of powdered pigment those portions of the pressure-sensitive adhesive layer 36 which have been made accessible through the open areas of the photoresist layer 38, exposure of the whole surface of the remaining photoresist layer to the actinic radiation, and application of the developer solution to dissolve away the remaining photoresist layer to yield an imaged proofing sheet which consists essentially of the carrier sheet 32, 31 having an overall layer of substantially transparent pressure-sensitive adhesive 36 in which is embedded the pigment powder image 37, as seen in processing step (b).

In this manner each of the desired number of proofing sheets is exposed to actinic radiation through a different one of the separation negatives of the set and is developed, colored with the appropriate pigment, and further processed to remove the residual photoresist materials to yield the plurality of proof sheets of which two shown at stage (b) carrying the images 37 and 39 of, for example, magenta and cyan. At this stage additional proof sheets would bear appropriate images in yellow and black if it be intended to form a four-color proof.

As shown in drawing step (c), the first of the imaged adhesive layers is transferred to an intermediate sheet of the present invention which comprises a matte-surfaced, abherent carrier film 35, a polymeric film stripping layer 34, and, to facilitate reception of the initial image layer, a coating of pressure-sensitive adhesive 36¹. The first carrier sheet 32 with its adhered release layer 31 is then removed from the adhesive layer 36, as at (d), thereby transferring this image layer to the intermediate sheet.

Similar transfer of the adhesive layer of the second sheet bearing pigment image 39 to the now fully accessible adhesive layer 36 of the first imaged layer with removal of the second carrier sheet and release layer yields the two color print shown at stage (e). The imaged layers of the remaining sheets of the set are likewise transferred in turn to form the registered multicolor composite.

The final step in the processing of the multi-color proof print is transfer of the multi-color composite to a selected receptor sheet 33, which may be, as earlier noted, a transparent film or the paper, foil or other web material which is to be used in the actual printing operation. Contact, under pressure, of the outermost adhesive layer 36 of the multi-color composite with the surface of the selected receptor sheet 33 followed by removal of the intermediate matte carrier sheet 35 results in the formation of the final proof print, as at (f), with the overlying stripping layer 34 protecting the composite proof and providing the desired matte finish to the print.

PREFERRED EMBODIMENT

In the following example there is more specifically described a typical representative of the preferred embodiment of the present invention.

A 75 μm polyester film was coated with a solution of the following composition using a 250 μm wire wound doctor bar at a speed of 15 m per minute and dried and cured at a temperature of 105° C. for about 90 seconds to form on the surface of the film a well-adhered release coating:

| | | |
|---|---|---|
| Dimethyl polysiloxane, 30% in xylene (SS-4164, General Electric) | 205. | gm |
| Curing catalyst (SS-4163c, General Electric) | 7.2 | gm |
| Toluene | 665. | gm |
| Hexane | 665. | gm |

The resulting carrier sheet material was coated with a solution of the following composition at a web speed of about 3 m per minute using a bead coat applicator roller operating at about 3 m per minute followed by drying at 95° C. for about five minutes to form the pressure-sensitive adhesive layer of the proofing sheet:

| | |
|---|---|
| Polyisobutylene (MW 100,000) | 160. gm |
| Polyisobutylene (MW 10,000) | 160. gm |
| Hexane | 1600. gm |
| Heptane | 6088. gm |

A final meniscus coating of a commercially available positive-working novolak resin type photoresist sensitized with a naphthaquinone diazide (AZ-111, Shipley Chem. Co.) diluted to about 4% solids with ethyl acetate was applied over the pressure-sensitive adhesive coating and dried at 95° C. for about three minutes to yield the finished color-proofing sheet material.

An intermediate transfer sheet was prepared by whirl coating a 350 μm matte surface polyester film at 300 rpm with a solution of the following composition followed by drying at 95° C. for about five minutes:

| | |
|---|---|
| "Nylon 6" polyamide resin (BCI Nylon 637) | 2. gm |
| Methanol | 18. gm |
| Isopropanol | 20. gm |

The substantially transparent stripping layer thus formed was overcoated in a whirl coater at 300 rpm with a triple layer of the polyisobutylene solution described above and dried for about five minutes at 95° C.

Four individual sheets were taken of the photoresist material and, along with the intermediate sheet, were edged-punched in the usual manner for use in a pin-type registering device. Each of the four color-proofing sheets were exposed in a commercial mercury vapor lamp plate-making vacuum frame device in registered face-to-face contact with prepunched separation negatives. All four registered assemblies were exposed at the same time for a duration of about 20 seconds. Each exposed proofing sheet was then developed in a commercially available aqueous photoresist developer solution (marketed by Keuffel & Esser Company, Morristown, NJ as Cat. No. 58-2365) at pH 12.5, washed and air dried at room temperature. The following color pigments were applied to the respective developed proofing sheets and the sheets were then overall exposed, redeveloped, and dried to yield the finished positive separation prints:

Black: carbon black powder (Raven 16—Cities Service Co.)
Cyan: beta-phthalocyanine blue powder (Irgalite Blue LGLD—Ciba-Geigy)
Yellow: metaxylidide bis-acrylamide yellow powder (CI Pigment Yellow 13)
Magenta: calcium lithol rubine powder (CI Pigment Red 57)

As depicted in the drawing, the black imaged sheet was firmly pressed into face-to-face contact with the intermediate sheet adhesive surface and the proofing sheet carrier film peeled away. Each of the cyan, yellow, and magenta imaged sheets were similarly transferred in register with intermediate removal of each respective carrier sheet except that of the finally positioned magenta image layer which temporarily served as a protective cover for the then completed four-color proof reproduction.

After thorough examination of the four-color composite transparency on a light table in order to test the quality of dot definition and the like, the final image layer carrier sheet was peeled from the composite and the exposed adhesive surface was firmly pressed into contact with the surface of the ultimate printing stock to firmly adhere the composite to the paper sheet. The film carrier of the intermediate sheet was then peeled from the composite leaving a matte finish print having a sharply-defined faithful reproduction of the original subject matter in a vivid print fully representative of the actual lithographic print to be obtained from the set of color separation negatives.

What is claimed is:
1. The method of providing a matte finish on color-proofing surprints which comprises:
 (a) providing a receptor sheet comprising a carrier sheet presenting a matte surface and, coated on said carrier sheet, a layer of substantially transparent film-forming polymeric material in intimate contact with said matte surface;
 (b) providing a color-proofing surprint image comprising a carrier sheet and a colored image layer adhered to said surprint carrier sheet;
 (c) adhering said film-forming polymeric layer to said image layer in a union exhibiting greater adhesion than the adhesion between said polymeric layer and said matte surface; and
 (d) separating said receptor carrier sheet from said polymeric layer by peeling apart at said matte surface interface, thereby depositing a complementary matte-surfaced polymeric film adhered to said surprint image layer.
2. The method of claim 1 wherein said receptor sheet further comprises a layer of tacky pressure-sensitive adhesive coated on said polymeric layer, whereby adhe- sion between said image and polymeric layers may be effected.

3. In a method of preparing a multicolor proofing surprint which comprises adhering to a receptor sheet surface a registered composite of imaged adhesive layers, each comprising a colored powder imagewise adhered to a substantially continuous layer of tacky pressure-sensitive adhesive composition, the improvement which provides a matte finish on said surprint, said improvement comprising:
   (a) adhering to the imaged layer intended to be the farthest disposed from said receptor sheet the polymeric coated layer of a cover sheet comprising a carrier sheet presenting a matte surface and, coated on said carrier sheet, said layer of substantially transparent film-forming polymeric material in intimate contact with said matte surface, the resulting union exhibiting greater adhesion than the adhesion between the film of said polymeric material and said matte surface; and
   (b) separating said carrier sheet from said polymeric film layer by peeling apart at said matte surface interface, thereby depositing as the outermost viewing surface of said surprint the complementary matte surface of said polymeric film.

4. The improvement according to claim 3 wherein said cover sheet further comprises a layer of tacky pressure-sensitive adhesive coated on said polymeric layer, whereby adhesion between said image and polymeric layers may be effected.

5. The improvement according to claim 3 where said film-forming polymeric material is selected from the group consisting of polyvinyl alcohol, polyvinylacetate, and polyamide resins.

* * * * *